(12) United States Patent
Kudela et al.

(10) Patent No.: US 10,886,053 B2
(45) Date of Patent: *Jan. 5, 2021

(54) RF CHOKE FOR GAS DELIVERY TO AN RF DRIVEN ELECTRODE IN A PLASMA PROCESSING APPARATUS

(71) Applicant: Applied Materials, Inc., Santa Clara, CA (US)

(72) Inventors: Jozef Kudela, Morgan Hill, CA (US); Carl A. Sorensen, Morgan Hill, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 16/282,085

(22) Filed: Feb. 21, 2019

(65) Prior Publication Data

US 2019/0189328 A1 Jun. 20, 2019

Related U.S. Application Data

(60) Division of application No. 15/668,064, filed on Aug. 3, 2017, now Pat. No. 10,304,607, which is a division
(Continued)

(51) Int. Cl.
*H05H 1/46* (2006.01)
*H01F 17/06* (2006.01)
(Continued)

(52) U.S. Cl.
CPC .......... *H01F 17/06* (2013.01); *C23C 16/455* (2013.01); *C23C 16/505* (2013.01); *H01F 27/08* (2013.01);
(Continued)

(58) Field of Classification Search
CPC ......... C30B 25/00; C30B 25/02; C30B 25/14; C30B 25/16; C30B 25/165; C30B 30/00;
(Continued)

(56) References Cited

U.S. PATENT DOCUMENTS 2,912,658 A 10/1959 Paluev
3,525,594 A 8/1970 Barrett
(Continued)

FOREIGN PATENT DOCUMENTS

CN 1932077 A 3/2007
EP 0753878 A1 1/1997
(Continued)

OTHER PUBLICATIONS

Notice of First Office Action for Chinese Patent Application No. 200880024220.0 dated Jan. 10, 2011.
(Continued)

*Primary Examiner* — Kenneth A Bratland, Jr.
(74) *Attorney, Agent, or Firm* — Patterson + Sheridan, LLP

(57) ABSTRACT

In large area plasma processing systems, process gases may be introduced to the chamber via the showerhead assembly which may be driven as an RF electrode. The gas feed tube, which is grounded, is electrically isolated from the showerhead. The gas feed tube may provide not only process gases, but also cleaning gases from a remote plasma source to the process chamber. The inside of the gas feed tube may remain at either a low RF field or a zero RF field to avoid premature gas breakdown within the gas feed tube that may lead to parasitic plasma formation between the gas source and the showerhead. By feeding the gas through an RF choke, the RF field and the processing gas may be introduced to the processing chamber through a common location and thus simplify the chamber design.

10 Claims, 9 Drawing Sheets

Related U.S. Application Data of application No. 14/249,459, filed on Apr. 10, 2014, now Pat. No. 9,761,365, which is a continuation of application No. 12/172,029, filed on Jul. 11, 2008, now Pat. No. 8,728,586.

(60) Provisional application No. 60/951,028, filed on Jul. 20, 2007.

(51) Int. Cl.

| | | |
|---|---|---|
| *H01J 37/32* | (2006.01) | |
| *C23C 16/455* | (2006.01) | |
| *C23C 16/505* | (2006.01) | |
| *H01F 27/08* | (2006.01) | |

(52) U.S. Cl.
CPC .... *H01J 37/3244* (2013.01); *H01J 37/32082* (2013.01); *H01F 2017/065* (2013.01); *H01J 2237/0206* (2013.01); *Y10T 117/10* (2015.01); *Y10T 117/1004* (2015.01); *Y10T 117/1008* (2015.01)

(58) Field of Classification Search
CPC ....... C30B 30/02; C30B 30/04; Y10T 117/00; Y10T 117/10; Y10T 117/1004; Y10T 117/1008; C23C 16/455; C23C 16/50; C23C 16/505; C23C 16/507; H01F 17/04; H01F 17/06; H01F 27/08; H01F 2017/065; H01J 37/32082; H01J 37/3244; H01J 2237/0206
USPC ........ 117/84, 88–89, 92, 103, 108, 200–202, 117/204; 427/569
See application file for complete search history.

(56) References Cited

U.S. PATENT DOCUMENTS

| | | | | |
|---|---|---|---|---|
| 4,796,079 | A | * | 1/1989 | Hettiger ................. H01P 1/227 174/260 |
| 5,038,713 | A | * | 8/1991 | Kawakami ........ H01J 37/32357 118/723 MA |
| 6,017,221 | A | * | 1/2000 | Flamm .................. H01J 37/321 204/192.32 |
| 6,401,653 | B1 | * | 6/2002 | Taniguchi ......... H01J 37/32192 118/723 ME |
| 8,728,586 | B2 | * | 5/2014 | Kudela ................. C23C 16/455 427/569 |
| 9,761,365 | B2 | * | 9/2017 | Kudela ............... H01J 37/3244 |
| 10,304,607 | B2 | * | 5/2019 | Kudela ................. C23C 16/505 |
| 2002/0089391 | A1 | * | 7/2002 | Miller .................. H03H 1/0007 333/12 |
| 2002/0125223 | A1 | | 9/2002 | Johnson et al. |
| 2007/0051388 | A1 | * | 3/2007 | Sorensen ............ C23C 16/4405 134/1.1 |
| 2007/0051471 | A1 | | 3/2007 | Kawaguchi et al. |
| 2009/0022905 | A1 | | 1/2009 | Kudela et al. |
| 2009/0151636 | A1 | | 6/2009 | White et al. |

FOREIGN PATENT DOCUMENTS

| | | |
|---|---|---|
| JP | 2002-288864 A | 10/2002 |
| JP | 2002-314124 A | 10/2002 |
| JP | 2005-255489 A | 9/2005 |
| JP | 2007-077502 A | 3/2007 |

OTHER PUBLICATIONS

Office Action dated Feb. 19, 2013 for Japanese Patent Application No: 2010-517055.
Office Action dated Dec. 24, 2013 for Japanese Patent Application No. 2010-517055.
Office action dated Jun. 4, 2014 for Chinese Patent Application no. 201210206264.3.
Office Action dated Aug. 5, 2015, for Chinese Patent Application No. 201210206264.3.
Office Action dated Sep. 8, 2015 for Japanese Application No. 2014-084558.
Office Action (with attached English translation) for Japanese Application No. 2014-084558 dated Mar. 3, 2015; 7 total pages.
Office Action (with attached English Summary of Official Letter) for Taiwanese Application No. 97126827 dated Apr. 14, 2015; 8 total pages.
Office Action dated Apr. 26, 2016 for Japanese Application No. 2014-084558.

* cited by examiner

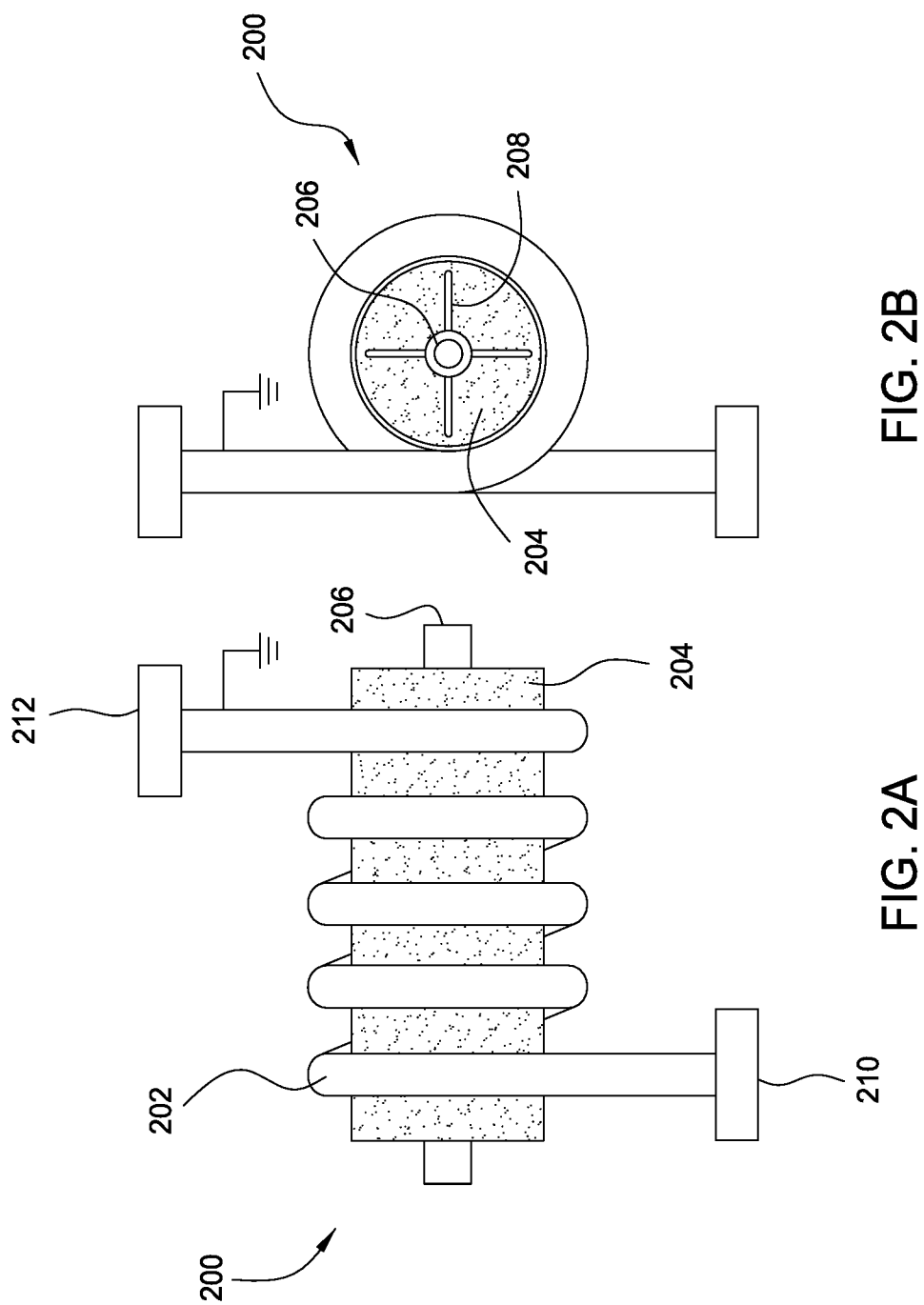

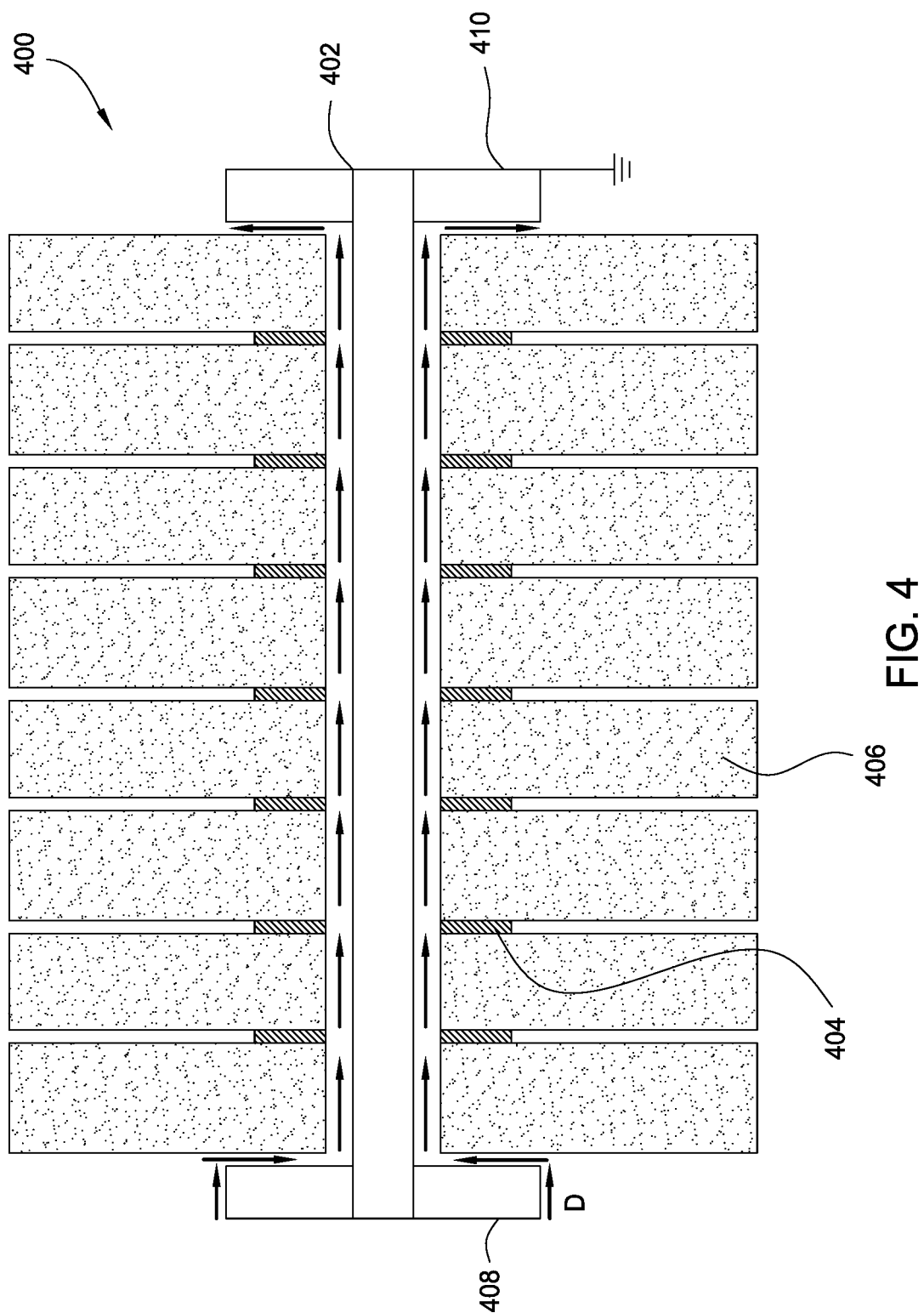

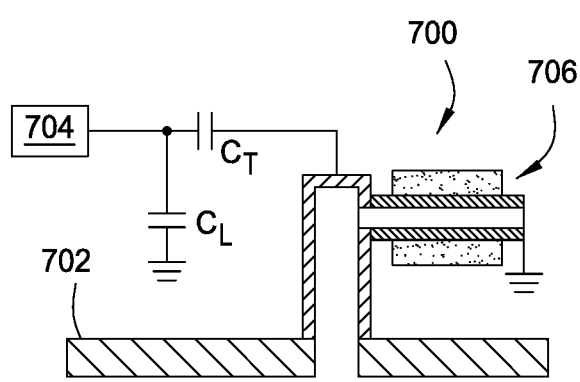
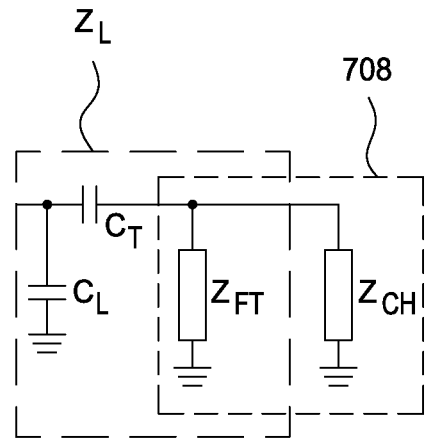
FIG. 7A      FIG. 7B
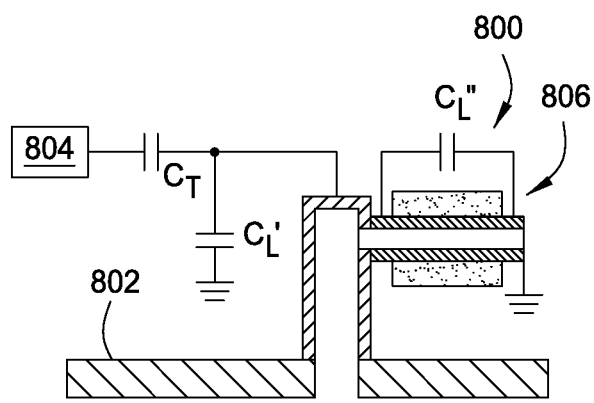
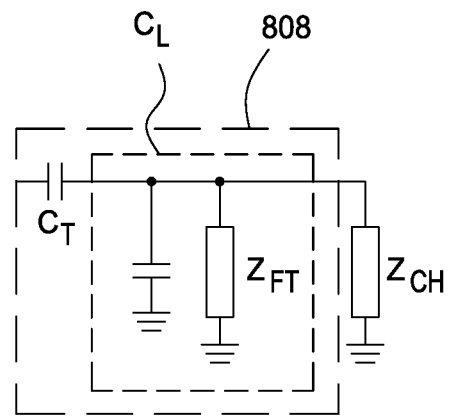
FIG. 8A      FIG. 8B

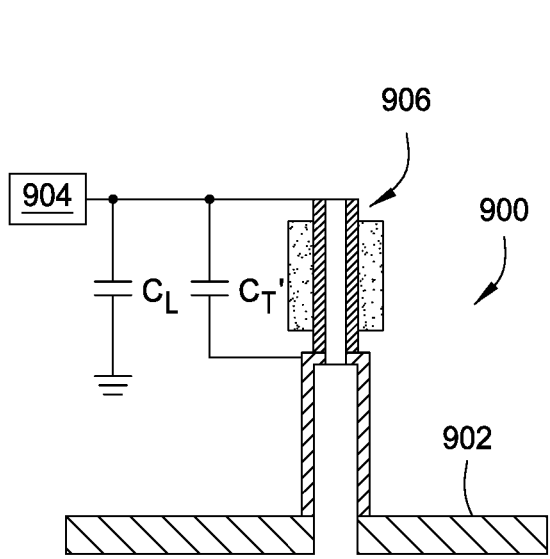
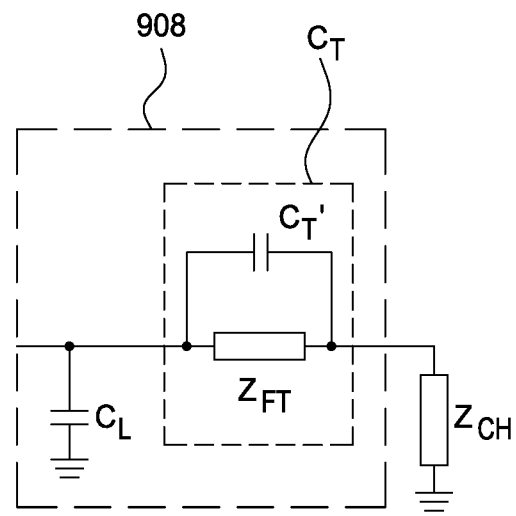
FIG. 9A    FIG. 9B
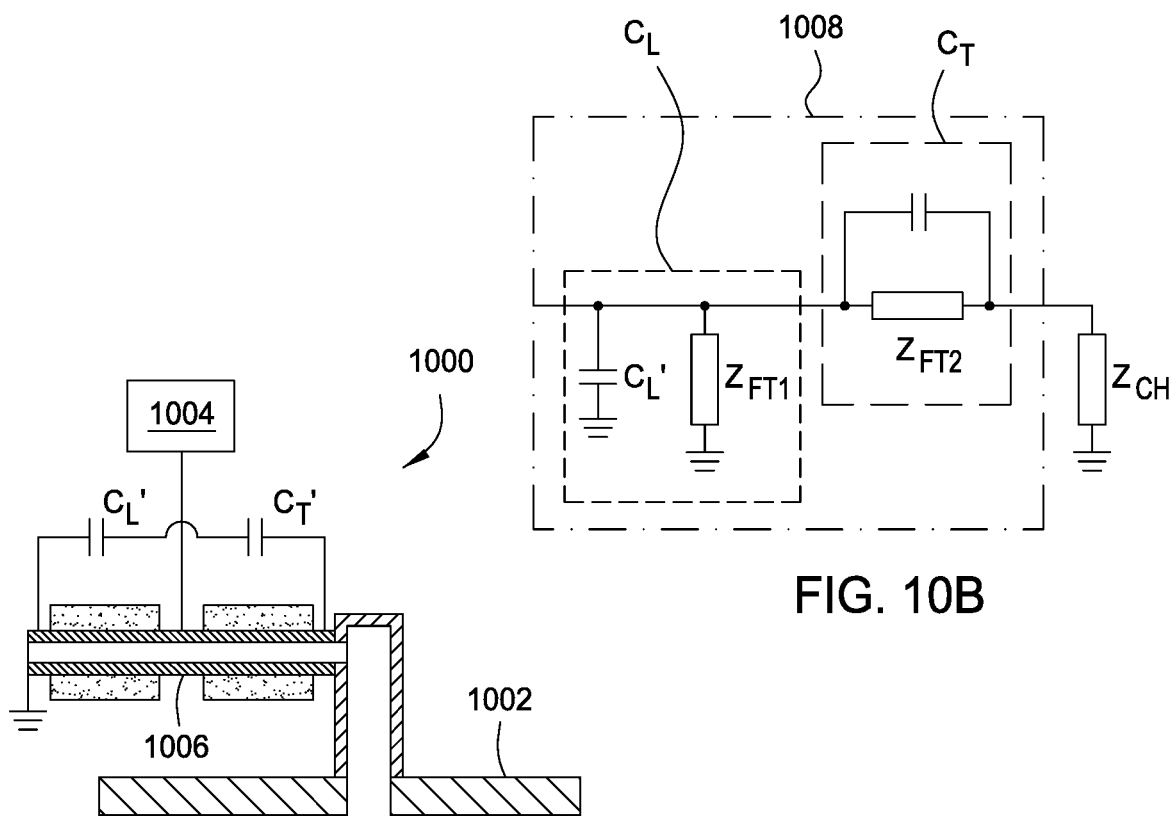
FIG. 10B
FIG. 10A

US 10,886,053 B2

RF CHOKE FOR GAS DELIVERY TO AN RF DRIVEN ELECTRODE IN A PLASMA PROCESSING APPARATUS

CROSS-REFERENCE TO RELATED APPLICATIONS

This application is a divisional of U.S. patent application Ser. No. 15/668,064, filed Aug. 3, 2017, which is a divisional of U.S. patent application Ser. No. 14/249,459, filed Apr. 10, 2014, which is a continuation of U.S. patent application Ser. No. 12/172,029, filed Jul. 11, 2008, which claims benefit of U.S. Provisional Patent Application Ser. No. 60/951,028, filed Jul. 20, 2007, each of which are herein incorporated by reference in their entirety.

BACKGROUND OF THE INVENTION

Field of the Invention

Embodiments of the present invention generally relate to an RF choke and gas feed tube for matching impedance in a plasma processing apparatus.

Description of the Related Art

As demand for larger flat panel displays continues to increase, so must the size of the substrate and hence, the processing chamber. As solar panel demand increases, higher RF field is sometimes necessary. One method for depositing material onto a substrate for flat panel displays or solar panels is plasma enhanced chemical vapor deposition (PECVD). In PECVD, process gases may be introduced into the process chamber through a showerhead and ignited into a plasma by an RF field applied to the showerhead. As substrate sizes increase, the RF field applied to the showerhead may also correspondingly increase. With the increase in RF field, the possibility of premature gas breakdown prior to the gas passing through the showerhead increases as does the possibility of parasitic plasma formation above the showerhead.

Therefore, there is a need in the art for an RF choke and gas feed through to reduce premature gas breakdown and parasitic plasma formation.

SUMMARY OF THE INVENTION

In large area plasma processing systems, process gases may be introduced to the chamber via the showerhead assembly which may be driven as an RF electrode. The gas feed tube, which is grounded, is electrically isolated from the showerhead. The gas feed tube may provide not only process gases, but also cleaning gases from a remote plasma source to the process chamber. The inside of the gas feed tube may remain at either a low RF field or a zero RF field to avoid premature gas breakdown within the gas feed tube that may lead to parasitic plasma formation between the gas source and the showerhead. By feeding the gas through an RF choke, the RF field and the processing gas may be introduced to the processing chamber through a common location and thus simplify the chamber design.

In one embodiment, an RF choke assembly includes a gas feed tube comprising a metal and one or more ferrite elements surrounding the gas feed tube.

In another embodiment, an apparatus is disclosed. The apparatus includes an RF power source, a gas source, and an RF choke assembly coupled between the power source and the gas source. The assembly includes a gas feed tube comprising a metal. The gas feed tube may comprise a first end coupled with the gas source, and a second end coupled with the RF power source. The feed tube may also comprise one or more ferrite elements surrounding the gas feed tube.

In another embodiment, gas delivery method includes flowing a gas through the inside of a metal tube. The metal tube may comprise a first end coupled to a gas source and to ground, and a second end coupled with an RF power source. The method may also include flowing RF current along the outside of the metal tube such that the gas flowing inside the metal tube is not exposed to the RF current.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a schematic view of an RF choke and gas feed through assembly according to one embodiment of the invention.

FIG. 2B is an end view of FIG. 2A.

FIG. 4 is a schematic cross sectional view of an RF choke according to another embodiment of the invention.

FIG. 7A is a schematic cross sectional view of an RF choke coupled to a plasma processing chamber according to one embodiment of the invention.

FIG. 7B is a circuit diagram of FIG. 7A.

FIG. 8A is a schematic cross sectional view of an RF choke coupled to a plasma processing chamber according to another embodiment of the invention.

FIG. 8B is a circuit diagram of FIG. 8A.

FIG. 9A is a schematic cross sectional view of an RF choke coupled to a plasma processing chamber according to another embodiment of the invention.

FIG. 9B is a circuit diagram of FIG. 9A.

FIG. 10A is a schematic cross sectional view of an RF choke coupled to a plasma processing chamber according to another embodiment of the invention.

FIG. 10B is a circuit diagram of FIG. 10A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In large area plasma processing systems, process gases may be introduced to the chamber via the showerhead assembly which may be driven as an RF electrode. The gas feed tube, which is grounded, is electrically isolated from the showerhead. The gas feed tube may provide not only process gases, but also cleaning gases from a remote plasma source to the process chamber. The inside of the gas feed tube may remain at either a low RF field or a zero RF field to avoid premature gas breakdown within the gas feed tube that may lead to parasitic plasma formation between the gas source and the showerhead. By feeding the gas through an RF choke, the RF field and the processing gas may be introduced to the processing chamber through a common location and thus simplify the chamber design.

The invention will be illustratively described below in relation to a PECVD chamber available from AKT, a subsidiary of Applied Materials, Inc., Santa Clara, Calif. It is to be understood that the invention is equally applicable to any chamber that may require energizing a gas into a plasma using an RF current including physical vapor deposition (PVD) chambers. It is also to be understood that the invention described below is equally applicable to PECVD chambers, etching chambers, physical vapor deposition (PVD) chambers, plasma processing chambers, and other chambers made by other vendors.

Figure 1A:
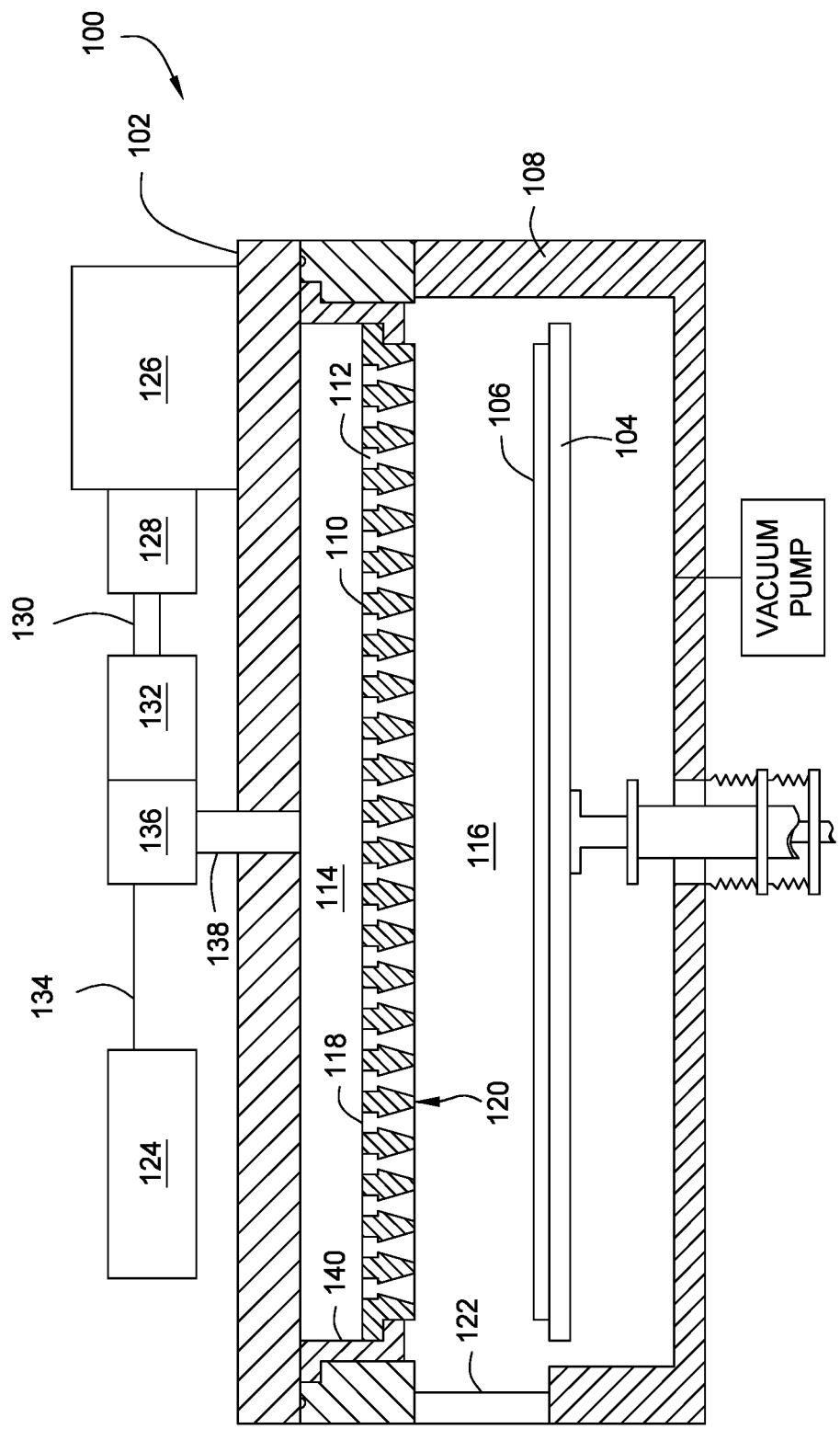
FIG. 1A is a schematic cross sectional view of a PECVD apparatus according to one embodiment of the invention.

FIG. 1A is a schematic cross sectional view of a PECVD apparatus 100 according to one embodiment of the invention. The apparatus 100 comprises a lid assembly 102 coupled with a chamber wall 108. Within the apparatus 100 a showerhead 110 may be disposed opposite a susceptor 104 upon which a substrate 106 may be disposed for processing. The showerhead 110 may be supported by a bracket 140. The substrate 106 may enter and exit the apparatus 100 through a slit valve 122 disposed in a chamber wall 108. The substrate 106 may comprise a flat panel display substrate, a solar substrate, a semiconductor substrate, and organic light emitting display (OLED) substrate, or any other substrate. The showerhead 110 may comprise one or more gas passageways 112 extending between a top surface 118 of the showerhead 110 and bottom surface of the showerhead. A plenum 114 may exist between the lid assembly 102 and the showerhead 110. Gas introduced into the plenum 114 may be evenly dispersed behind the showerhead 110 for introduction into the processing space 116 through the gas passages 112.

Gas may be introduced into the plenum 114 through a gas input 138. The gas may be provided by a gas source 126. In one embodiment, the gas source 126 may comprise a processing gas source. In another embodiment, the gas source 126 may comprise a cleaning gas source. The gas may travel from the gas source 126 through a remote plasma source 128 and cooled coupling 130 to an RF choke 132. The RF choke 132 may be coupled to a knuckle connector 136 that feeds the gas into the gas input 138. An RF power source 124 may also be coupled with the knuckle connector 136 by an RF feed 134.

Figure 1B:
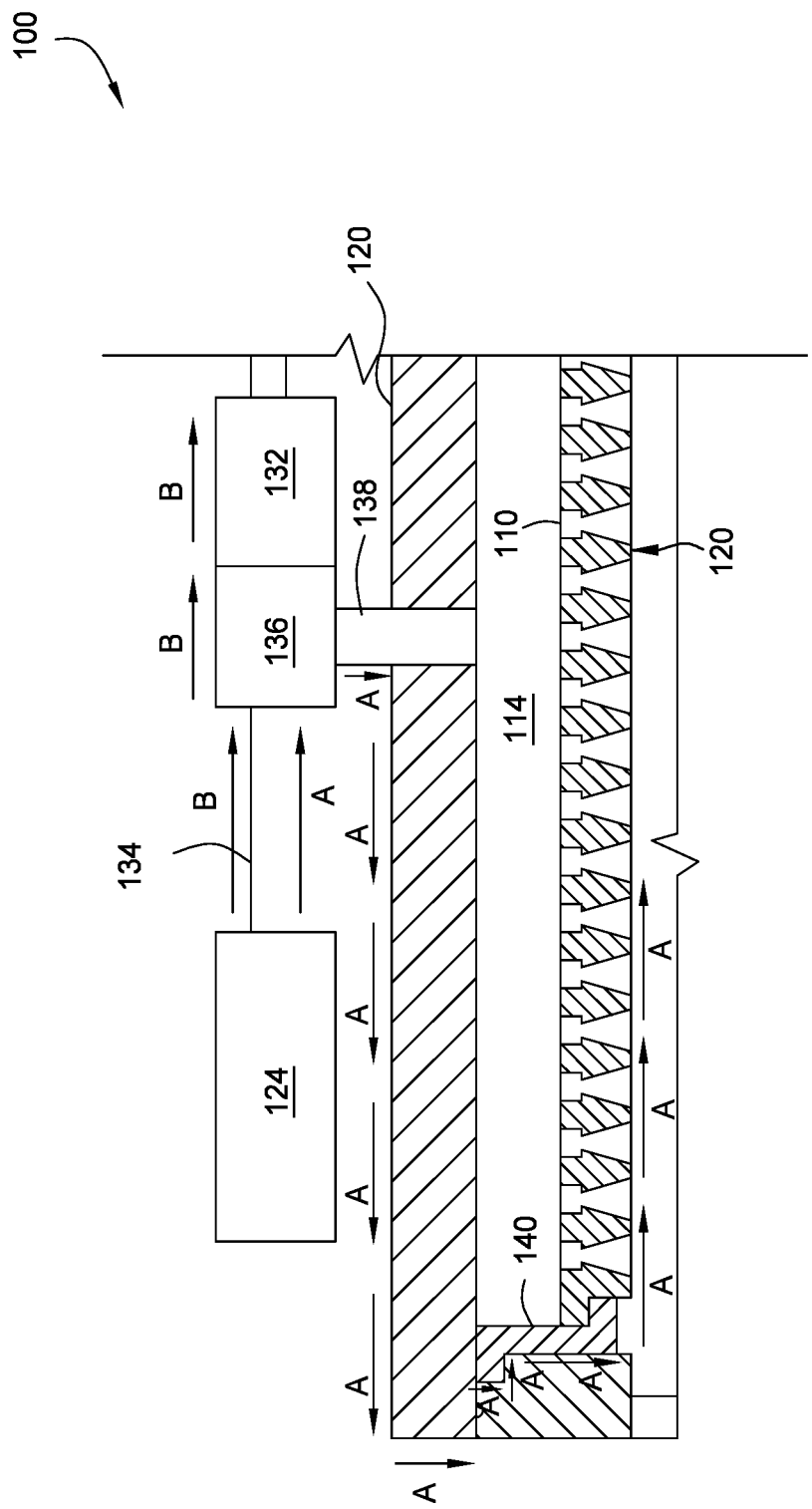
FIG. 1B is a schematic enlarged view of a portion of FIG. 1A.

Coupling the gas and the RF power through a common location may, on its face, appear to be unsafe. However, RF current has a "skin effect" in traveling on conductive surfaces. RF current travels as close as possible to the source driving it. Thus, RF current travels on the surface of a conductive element and penetrates only to a certain, predeterminable depth (i.e., the skin) of the conductive element. The predeterminable depth may be calculated as a function of the frequency of the RF current, the permeability of the material of the conductive element, and the conductivity of the conductive element. Thus, when a conductive element is thicker than the predetermined depth of the RF current penetration, the RF current may not directly interact with the gas flowing therein. FIG. 1B is a schematic cross sectional view of a portion of FIG. 1A. FIG. 1B shows the path the RF current follows to the showerhead (represented by arrows "A") and the path through the RF choke (represented by arrows "B").

As may be seen from FIG. 1B, the RF current flows on the outside of the RF feed, the outside of the gas input 138, the top of the lid 102, the outside edge of the lid 102, the surface of the bracket 140 opposite the plenum 114, and finally across the bottom surface 120 of the showerhead. Once the RF current reaches the bottom surface 120 of the showerhead 110, the gas may ignite into a plasma either within hollow cathode cavities that may be present within the gas passages 112 or within the processing space 116. The RF current may also travel along the top of the knuckle connector 136 and outside the RF choke 132. The longer the distance that the RF current has to flow, the greater the impedance. Thus, for a center fed RF current, as chamber size increases, the impedance to the showerhead also increases.

An RF choke may be used between the RF power source and the gas source to ensure an approximately uniform attenuation of voltage difference between the RF power source and the gas delivery system. The voltage drop across the RF choke may be approximately equal to the voltage level of the gas distribution showerhead. Additionally, the voltage drop along the RF choke may be substantially uniform. Therefore, the RF power output from the RF power source that maintains and ignites the plasma within the processing chamber may be known and repeatable. The RF choke may maximize the voltage transfer to the showerhead and thus make the impedance of the RF source substantially equal to the impedance of the load.

FIG. 2A is a schematic view of an RF choke 200 according to one embodiment of the invention. FIG. 2B is a cross sectional view of FIG. 2A. The RF choke 200 comprises a coil 202 wrapped around a ferrite material 204. Within the ferrite material 204, a cooling tube 206 may be disposed. In one embodiment, the cooling tube 206 may comprise copper. One or more fins 208 may radiate out from the cooling tube 206 to extend the cooling surfaces further out into the ferrite material 204 and dissipate heat from the coil 202. The coil 202 may wrap a plurality of times around the ferrite material 204. The coil 202 may be sufficiently thick to prevent penetration of the RF current into the inside of the coil 202. One end 210 of the coil 202 may be coupled with the gas input to the processing chamber and the other end 212 may be coupled to ground and the gas source. Thus, the RF current flows along the outside or skin of the coil 202 from the gas input to ground.

The inductance increases the further that the RF current travels. Given a sufficient distance, the inductance along the RF choke may be substantially equal to the inductance of the showerhead. By increasing the radius, the length, or the number of turns in the coil 202, the inductance may be increased. Additionally, the RF current, as it travels along the outside of the coil 202, contacts the ferrite material 204 and may result in a high impedance. The length of the coil 202 should be sufficiently short to ensure the impedance of the RF choke is not greater than the impedance of the load to the showerhead. If the impedance of the RF choke is greater than the impedance of the load, then the RF choke 200 may fail.

The ferrite material 204 may comprise a high frequency low-loss ferrite material. In one embodiment, the ferrite material 204 may comprise half-cylinder blocks forming a compact cylindrical ferrite core. In another embodiment, the ferrite material 204 may comprise quarter cylinder blocks forming a compact cylindrical ferrite core. The ferrite material 204 raises the permeability and thus raises the inductance. The ferrite material 204, coupled with the increased RF path provided by the coil 202 brings down the resonance of the RF current because of the capacitance created by the RF choke 200. The RF choke 200 has a high RF impedance to create an RF to ground isolation.

The ferrite material 204 increases the permeability and also the inductance. The ferrite material 204 additionally provides an additional voltage drop between the RF source and ground. The ferrite material 204 may act as a thermal insulator and thus reduce the heat loss of the coil 202.

The coil 202 may comprise aluminum and be sufficiently thick as to prevent penetration of the RF current into the inside of the coil where the gas may flow. In one embodiment, the coil 202 may comprise hard anodized aluminum. In another embodiment, the coil 202 may comprise stainless steel. The inner surface of the coil 202 may be resistive against cleaning gases from a remote plasma source (RPS) such as fluorine and fluorine radicals. The coil 202 may have a large cross section to permit a high gas conductance and thus a safe pressure window for stable RPS operation. Because the RF field does not penetrate into the inside of the coil 202, the gas passing through the coil 202 does not see the RF field and thus may not ignite into a plasma. In other words, the inside of the coil 202 may comprise a field free region. Any current that penetrates into the coil 202 or that does not dissipate by the end of the coil and thus encounters the gas may be so low compared to the RF current that enters the showerhead that the no plasma may form. If a plasma forms in the RF choke 200, the amount of RF current flowing to the RF choke 200 may increase and cause a decrease in the RF current to the showerhead. In one embodiment, the ferrite elements may not be present.

Figure 3:
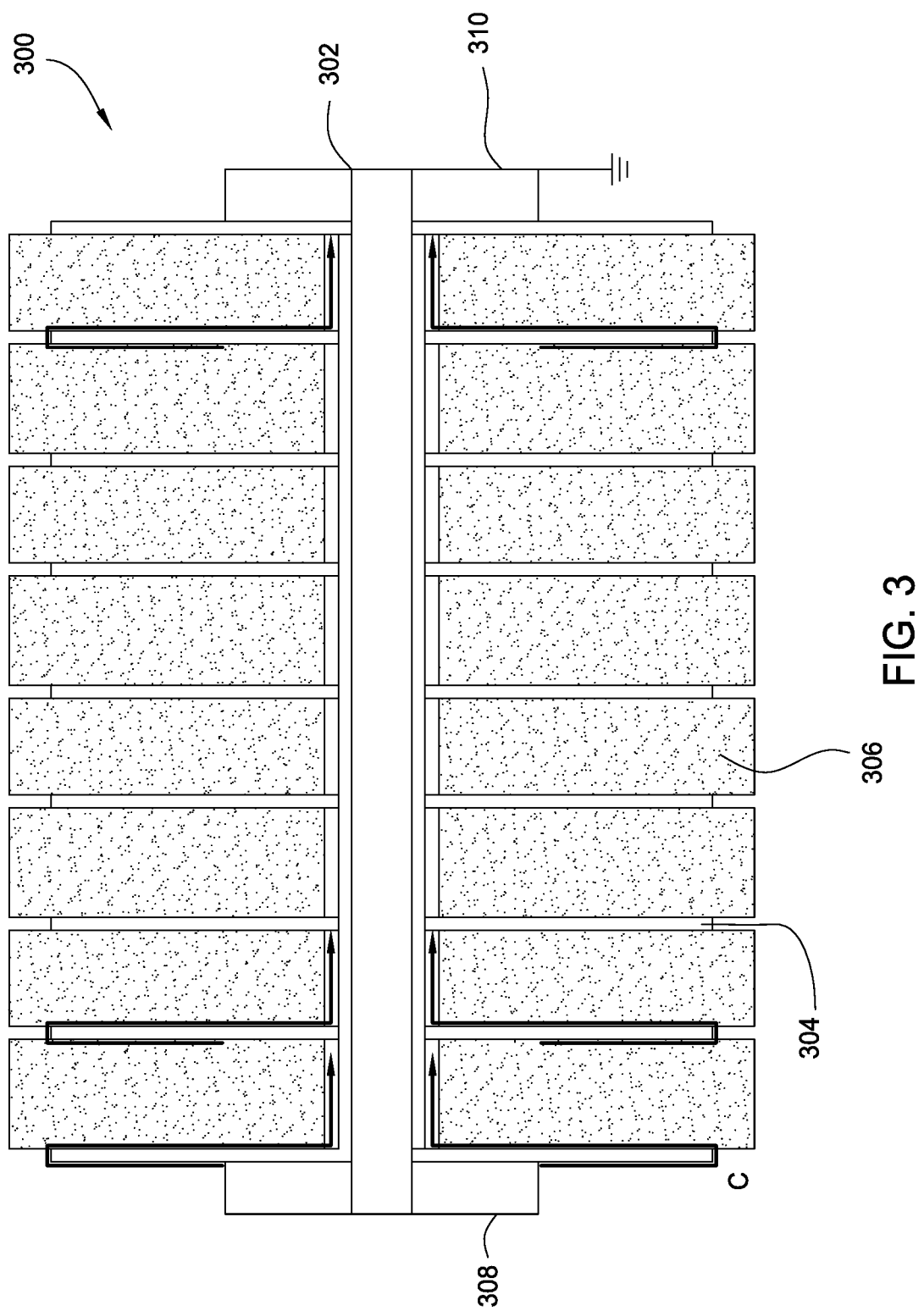
FIG. 3 is a schematic cross sectional view of an RF choke and gas feed through assembly according to another embodiment of the invention.

FIG. 3 is a schematic cross sectional view of an RF choke 300 according to another embodiment of the invention. The RF choke 300 comprises a gas tube 302 having one or more fins 304 extending radially outward from the gas tube 302. In one embodiment, the fins 304 may comprise aluminum. One or more ferrite disks 306 may also encircle the gas tube 302 and be disposed between fins 304. In one embodiment, the ferrite disks 306 may comprise low-loss ferrites having half donut pairs coupled together to form electromagnetically continuous toroids. In another embodiment, the ferrite disks 306 may comprise low-loss ferrites having a ring shape that each completely encircle the gas tube 302. It is to be understood that other shapes of the ferrite disks 306 may be utilized. A first end 308 of the RF choke 300 may be coupled to the gas input to the process chamber while a second end 310 of the RF choke 300 may be coupled to ground. The RF current may travel along an RF path "C" outside of the gas tube 302 and along the fins 304. In one embodiment, the fins 304 may extend radially from the gas tube 302 for a distance greater than the distance than the ferrite disks 306 extend radially from the gas tube 302. To accommodate high RF currents, the gas tube 302 may be lengthened, more ferrite disks 306 and fins 304 may added. In one embodiment, the distance that the fins 304 extend from the gas tube 302 may be increased. In one embodiment, the RF choke 300 may be cooled by drilling cooling channels into the gas tube 302. In one embodiment, the ferrite disks 306 may not be present.

FIG. 4 is a schematic cross sectional view of an RF choke 400 according to another embodiment of the invention. The RF choke 400 comprises a gas tube 402 separated from each other by one or more O-rings 404 extending radially outward from the gas tube 402. In one embodiment, the O-rings 404 may comprise silicon rubber. The one or more O-rings 404 may permit air to circulate around the ferrite disks 406 and cushion the ferrite disks 406 from rubbing against one another. The O-rings 404 may space the adjacent ferrite disks 406 apart by a predetermined distance. One or more ferrite disks 406 may also encircle the gas tube 402 and be disposed between O-rings 404. In one embodiment, the O-rings 404 may be replaced by spacer elements that may create a small distance between adjacent ferrite disks 406. In one embodiment, an air gap may be present between adjacent ferrite disks 406. In one embodiment, the ferrite disks 406 may comprise a unitary material encircling the gas tube 402 and spanning a predetermined length of the gas tube 402.

In one embodiment, the ferrite disks 406 may comprise low-loss ferrites having half donut pairs coupled together to form electromagnetically continuous toroids. In another embodiment, the ferrite disks 406 may comprise low-loss ferrites having a ring shape that each completely encircle the gas tube 402. A first end 408 of the RF choke 400 may be coupled to the gas input to the process chamber while a second end 410 of the RF choke 400 may be coupled to ground. The RF current may travel along an RF path "D" outside of the gas tube 402. To accommodate high RF currents, the gas tube 402 may be lengthened and more ferrite disks 406 may added. In one embodiment, the RF choke 400 may be cooled by drilling cooling channels into the gas tube 402. In one embodiment, the ferrite disks 406 may not be present.

Figure 5:
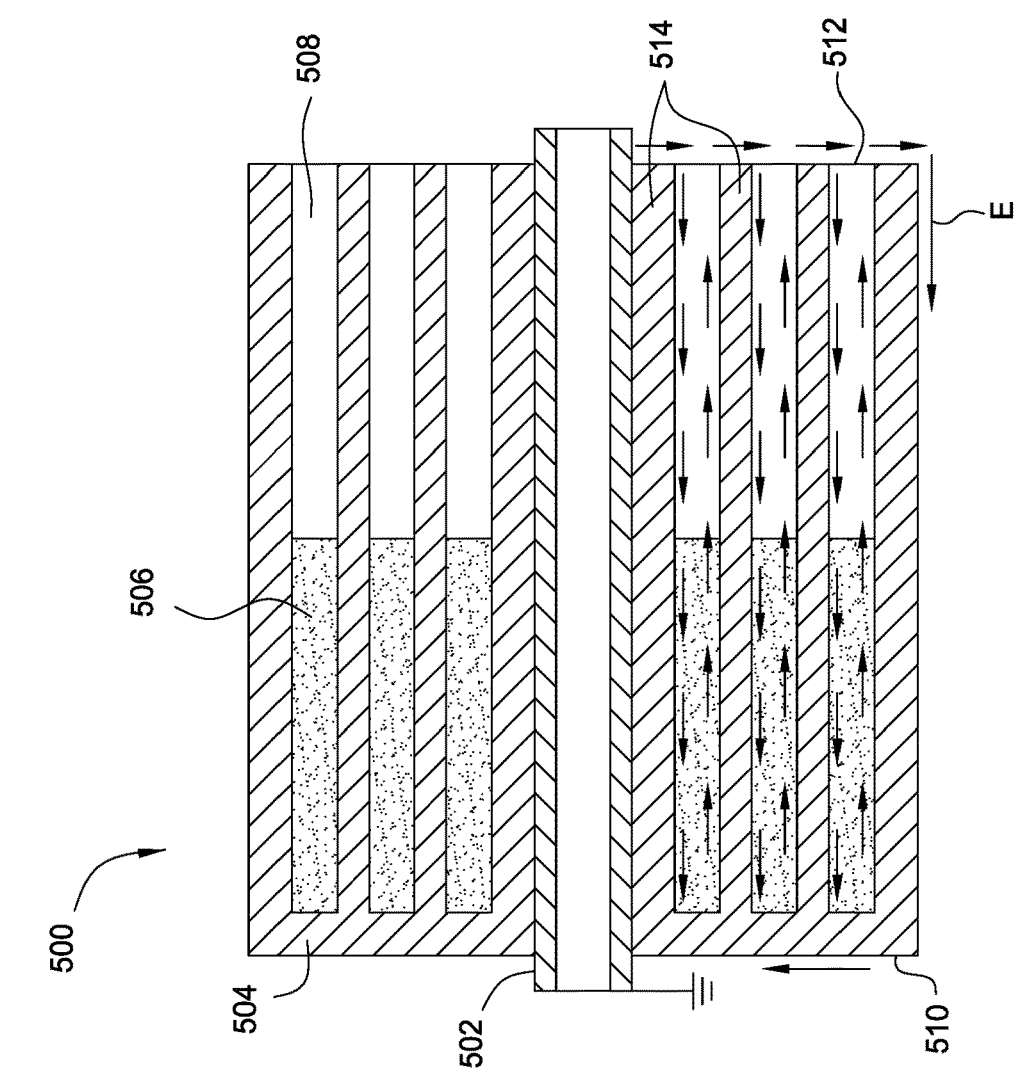
FIG. 5 is a schematic cross sectional view of an RF choke according to another embodiment of the invention.

FIG. 5 is a schematic cross sectional view of an RF choke 500 according to another embodiment of the invention. The RF choke 500 comprises a gas feed tube 502 through which the processing gas may flow. A cylinder portion 504 may surround the gas tube 502. In one embodiment, the cylinder portion 504 may comprise a conductive material. In another embodiment, the cylinder portion 504 may comprise metal. The cylinder portion 504 may have a first end 510 and a second end 512. The first end 510 may have a substantially closed end while the second end 512 may comprise a substantially open end with one or more extensions 514 extending from the first end 510. In between the extensions 514, ferrite material 506 may be disposed. Additionally and/or alternatively, air pockets 508 may be present between the extensions 514. The RF current travels along the outside of the gas tube 502 a shown by arrows "E" and along the surface of the cylinder 510 including the extensions 514. In so doing, the impedance is increased due to the increased RF path length and the exposure to the ferrite material 506.

Figure 6:
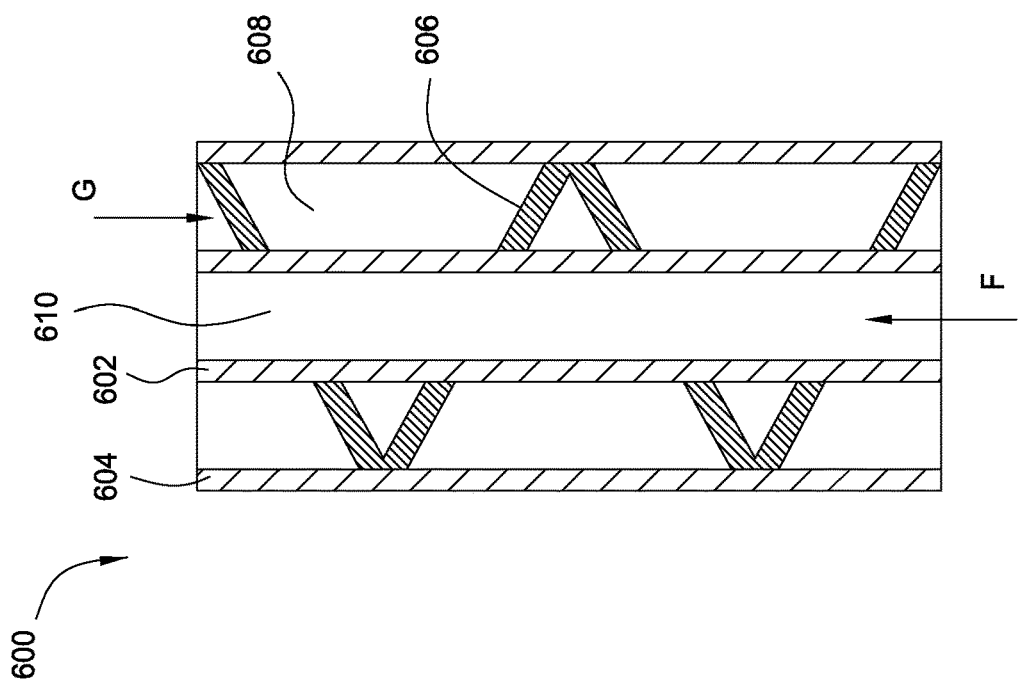
FIG. 6 is a schematic cross sectional view of a gas feed tube according to one embodiment of the invention.

FIG. 6 is a schematic cross sectional view of a gas feed tube 600 according to one embodiment of the invention. The gas feed tube 600 may comprise an inner tube 602 that is substantially surrounded by an outer tube 604. The inner tube 602 may be spaced from the outer tube 604 by an outer path 608. A cooling fluid may move through the outer path 608 as shown by arrow "G". To permit the cooling fluid to more in a non-linear path and thus, increase the residence time in the outer path, the cooling fluid may encounter several disturbances 606 to change the flow path of the cooling fluid. In one embodiment, the disturbance 606 may be a wire spun around the inner tube 602. In another embodiment, the disturbance 606 may comprise one or more flanges extending between the inner tube 602 and the outer tube 604. The processing gas may flow along an inner path 610 within the inner tube 602 as shown by arrow "F".

FIG. 7A is a schematic cross sectional view of an RF choke coupled to a plasma processing chamber according to one embodiment of the invention. FIG. 7B is a circuit diagram of FIG. 7A. The processing gas enters the system 700 through the RF choke 706 and the backing plate 702. The RF power is supplied by the RF power source 704. The RF voltage at the gas inlet (i.e., the ground side of the RF choke 706) is zero. The RF choke 706 is in parallel with the load. The RF choke 706 is deigned to have a high RF impedance and may be inductive or capacitive. The RF choke 706 may operate at or near the resonance with or without the help of external and/or stray capacitances. In terms of an equivalent electrical circuit, the Pi network 708 may comprise the load capacitor $C_L$, tuning capacitor $C_T$, and the impedance of the RF choke $Z_{FT}$. The load impedance $Z_L$ may comprise the impedance of the RF choke $Z_{FT}$ and the impedance of the chamber $Z_{CH}$.

FIG. 8A is a schematic cross sectional view of an RF choke coupled to a plasma processing chamber according to one embodiment of the invention. FIG. 8B is a circuit diagram of FIG. 8A. The processing gas enters the system 800 through the RF choke 806 and the backing plate 802. The RF power is supplied by the RF power source 804. The RF voltage at the gas inlet (i.e., the ground side of the RF choke 806) is zero. The RF choke 806 is in parallel with the load. The RF choke 806 is deigned to be capacitive with or without external capacitive loads $C_{L'}$, $C_u$ forming the load capacitor $C_L$ in the reverse L-type matching network 808. In terms of an equivalent electrical circuit, the reverse L-type matching network may comprise the load capacitor $C_L$, tuning capacitor $C_T$, and the impedance of the RF choke $Z_{FT}$. The load capacitor $C_L$ may comprise the impedance of the RF choke $Z_{FT}$ and an external capacitive load $C_{L'}$. The RF choke 806 may be considered part of the load capacitor in the reverse L-type matching network 808.

FIG. 9A is a schematic cross sectional view of an RF choke coupled to a plasma processing chamber according to one embodiment of the invention. FIG. 9B is a circuit diagram of FIG. 9A. The processing gas enters the system 900 through the RF choke 906 and the backing plate 902. The RF power is supplied by the RF power source 904. The RF choke 906 may be considered part of a tuning capacitor $C_T$ in an L-type or Pi-matching network 908. The RF choke 906 is in series with the load. The RF choke 906 is designed to be capacitive with or without external tuning capacitors $C_T$, forming the tuning capacitor in the L-type matching circuit. In terms of an equivalent electrical circuit, the L-type matching network may comprise the load capacitor $C_L$ and the tuning capacitor $C_T$. The tuning capacitor $C_T$ may comprise the impedance of the RF choke $Z_{FT}$, and an external tuning capacitor $C_{T'}$.

FIG. 10A is a schematic cross sectional view of an RF choke coupled to a plasma processing chamber according to one embodiment of the invention. FIG. 10B is a circuit diagram of FIG. 10A. The processing gas enters the system 1000 through the RF choke 1006 and the backing plate 1002. The RF power is supplied by the RF power source 1004. The RF voltage at the gas inlet (i.e., the ground side of the RF choke 1006) is zero. Two RF chokes 1006 or two sections of one RF choke 1006 may be put together to be the load and tune elements in an L-type or Pi-type matching network 1008. The RF chokes 1006 are designed to be capacitive with or without external load and tuning capacitors $C_{L'}$ and $C_{T'}$. In terms of an equivalent electrical circuit, the network 1008 may comprise the load capacitor $C_L$ and the tuning capacitor $C_T$. The load capacitor $C_L$ may comprise an external load capacitor $C_{L'}$ and the impedance of the first RF choke $Z_{FT1}$. The tuning capacitor may comprise the impedance of the second RF choke $Z_{FT2}$ and an external tuning capacitor $C_{T'}$.

Figure 11B:
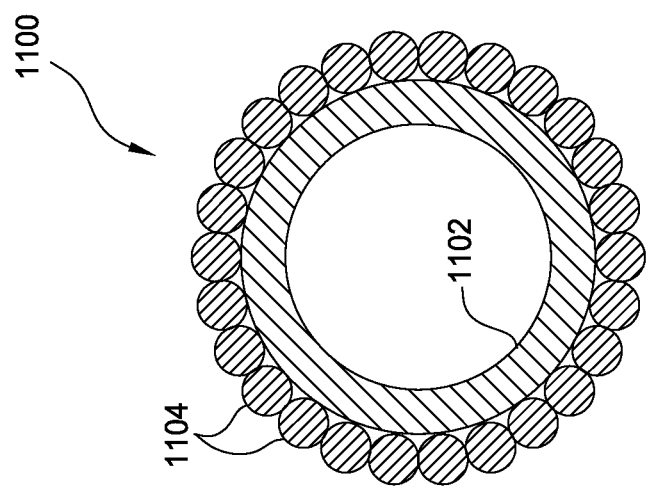
FIG. 11B is a schematic cross sectional view of the RF choke 1100 of FIG. 11A.
Figure 11A:
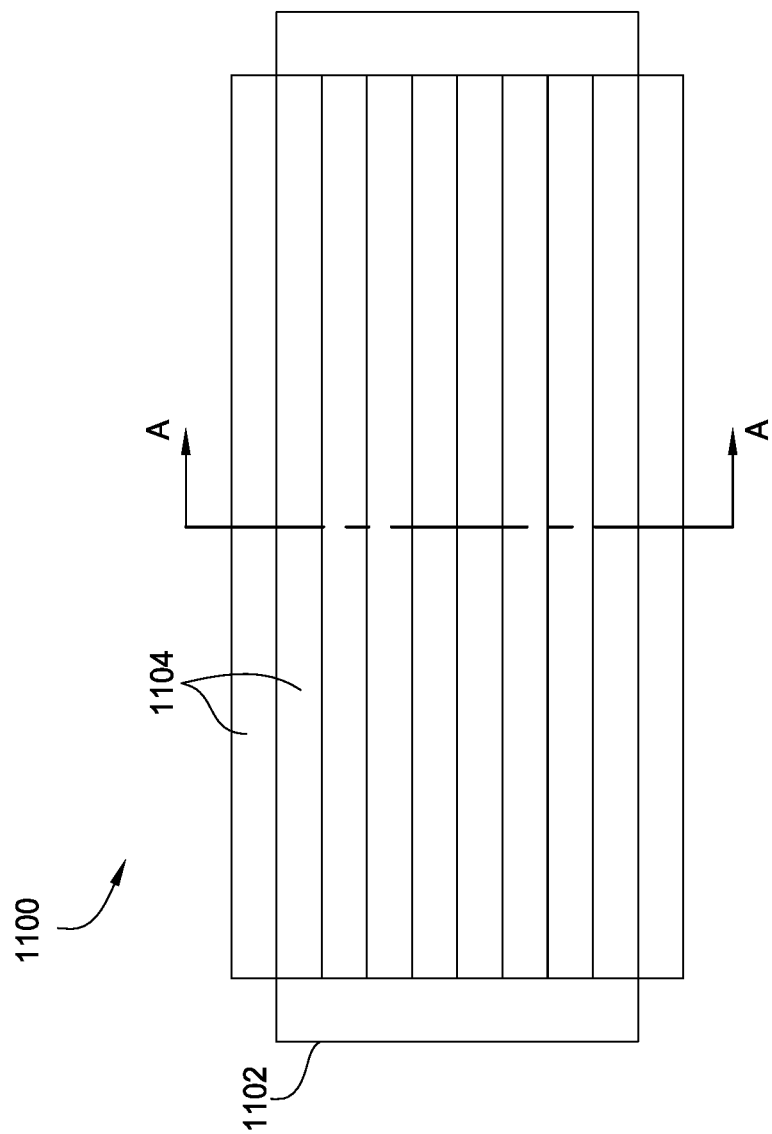
FIG. 11A is a schematic view of an RF choke 1100 according to another embodiment of the invention.

FIG. 11A is a schematic view of an RF choke 1100 according to another embodiment of the invention. FIG. 11B is a schematic cross sectional view of the RF choke 1100 of FIG. 11A taken along line H-H. As shown in FIGS. 11A and 11B, the ferrite elements 1104 may extend lengthwise along the gas tube 1102. One or more ferrite elements 1104 may be present and may substantially cover the outer surface of the gas tube 1102.

By placing an RF choke between a gas source and a processing chamber, parasitic plasma may be reduced. The RF choke may comprise a gas tube having a wall thickness greater than the maximum expected penetration of the RF current. Additionally, the RF choke may have a sufficiently long RF path to render the impedance of the RF choke substantially equal to the impedance of the load to the showerhead.

While the foregoing is directed to embodiments of the present invention, other and further embodiments of the invention may be devised without departing from the basic scope thereof, and the scope thereof is determined by the claims that follow.

The invention claimed is:

1. An RF choke assembly, comprising:
   a gas feed tube comprising a metal; and
   an annular ferrite element directly coupled to an outer circumference of the gas feed tube and at least partially circumscribing the gas feed tube.

2. The assembly of claim 1, wherein the ferrite element comprises a plurality of ferrite disks.

3. The assembly of claim 2, wherein the plurality of ferrite disks are spaced apart.

4. The assembly of claim 3, wherein the plurality of ferrite disks are spaced apart by one or more O-rings.

5. The assembly of claim 2, wherein each ferrite disk comprises a unitary ring that completely circumscribes the gas feed tube.

6. The assembly of claim 2, wherein each ferrite disk comprises a half donut pair coupled together to form a continuous ring that circumscribes the gas feed tube.

7. The assembly of claim 1, wherein the gas feed tube comprises aluminum.

8. The assembly of claim 1, wherein the gas feed tube comprises a first inner tube surrounded by a second outer tube.

9. The assembly of claim 8, wherein the first inner tube is spaced from the second outer tube by a fluid pathway.

10. The assembly of claim 9, wherein one or more disturbance elements are disposed in the fluid pathway, the one or more disturbance elements positioned to alter a flow of cooling fluid between the first inner tube and the second outer tube.

* * * * *